US009472560B2

United States Patent
Ramaswamy et al.

(10) Patent No.: US 9,472,560 B2
(45) Date of Patent: Oct. 18, 2016

(54) MEMORY CELL AND AN ARRAY OF MEMORY CELLS

(71) Applicant: Micron Technology, Inc., Boise, ID (US)

(72) Inventors: Durai Vishak Nirmal Ramaswamy, Boise, ID (US); Wayne Kinney, Emmett, ID (US); Marco Domenico Tiburzi, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 14/305,459

(22) Filed: Jun. 16, 2014

(65) Prior Publication Data

US 2015/0364565 A1    Dec. 17, 2015

(51) Int. Cl.
*G11C 11/22* (2006.01)
*H01L 27/115* (2006.01)

(52) U.S. Cl.
CPC ... *H01L 27/11514* (2013.01); *H01L 27/11507* (2013.01)

(58) Field of Classification Search
CPC ............ G11C 11/22–11/2297; G11C 11/5657
USPC .................. 365/145, 149, 148, 158
See application file for complete search history.

(56) References Cited

U.S. PATENT DOCUMENTS

| 6,236,076 | B1 | 5/2001 | Arita et al. |
| 6,370,056 | B1 | 4/2002 | Chen et al. |
| 6,674,109 | B1 | 1/2004 | Fujimori et al. |
| 6,717,215 | B2 | 4/2004 | Fricke et al. |
| 6,885,048 | B2 | 4/2005 | Tarui et al. |
| 7,180,141 | B2 | 2/2007 | Eliason et al. |
| 7,525,830 | B2 | 4/2009 | Kang |
| 7,902,594 | B2 | 3/2011 | Ono |
| 8,021,897 | B2 | 9/2011 | Sills et al. |
| 8,304,823 | B2 | 11/2012 | Boescke |
| 8,796,085 | B2 | 8/2014 | Koldiaev |

(Continued)

FOREIGN PATENT DOCUMENTS

| JP | 2009-170511 | 7/2009 |
| TW | 449924 | 8/2001 |

(Continued)

OTHER PUBLICATIONS

U.S. Appl. No. 13/964,309, filed Aug. 12, 2013, Karda et al.

(Continued)

*Primary Examiner* — Han Yang
(74) *Attorney, Agent, or Firm* — Wells St. John, P.S.

(57) ABSTRACT

A memory cell includes a first electrode and a second electrode. A select device and a programmable device are in series with each other between the first and second electrodes. The select device is proximate and electrically coupled to the first electrode. The programmable device is proximate and electrically coupled to the second electrode. The programmable device includes a radially inner electrode having radially outer sidewalls. Ferroelectric material is radially outward of the outer sidewalls of the inner electrode. A radially outer electrode is radially outward of the ferroelectric material. One of the outer electrode or the inner electrode is electrically coupled to the select device. The other of the outer electrode and the inner electrode is electrically coupled to the second electrode. Arrays of memory cells are disclosed.

29 Claims, 5 Drawing Sheets

(56) References Cited

U.S. PATENT DOCUMENTS

| | | |
|---|---|---|
| 2002/0125536 A1 | 9/2002 | Iwasa et al. |
| 2003/0183936 A1* | 10/2003 | Ito et al. .............. 257/758 |
| 2004/0004240 A1* | 1/2004 | Nishikawa ............ 257/303 |
| 2004/0036111 A1 | 2/2004 | Nishikawa et al. |
| 2004/0090815 A1* | 5/2004 | Tajiri ............ G11C 13/0007 365/148 |
| 2005/0282296 A1 | 12/2005 | Hsu et al. |
| 2006/0014307 A1 | 1/2006 | Kweon |
| 2007/0108524 A1 | 5/2007 | Ito et al. |
| 2007/0272960 A1 | 11/2007 | Hsu et al. |
| 2008/0225569 A1 | 9/2008 | Nawano |
| 2009/0095950 A1* | 4/2009 | Lieber ............ B82Y 10/00 257/4 |
| 2010/0110753 A1 | 5/2010 | Slesazeck |
| 2010/0110758 A1* | 5/2010 | Li ............ G11C 13/0007 365/148 |
| 2010/0140589 A1 | 6/2010 | Ionescu |
| 2010/0321975 A1* | 12/2010 | Kimura et al. ........... 365/145 |
| 2011/0033955 A1 | 2/2011 | Kang |
| 2011/0248324 A1 | 10/2011 | Kang |
| 2012/0248398 A1 | 10/2012 | Liu |
| 2012/0280291 A1 | 11/2012 | Lee et al. |
| 2012/0319185 A1 | 12/2012 | Liang et al. |
| 2013/0043455 A1 | 2/2013 | Bateman |
| 2013/0056698 A1 | 3/2013 | Satoh et al. |
| 2013/0126816 A1 | 5/2013 | Tang et al. |
| 2014/0153312 A1 | 6/2014 | Sandhu et al. |
| 2014/0269046 A1 | 9/2014 | Laurin et al. |

FOREIGN PATENT DOCUMENTS

| | | |
|---|---|---|
| TW | 483170 | 4/2002 |
| WO | WO 2008-073529 | 6/2008 |
| WO | PCT/US2014/047570 | 11/2014 |
| WO | PCT/US2014-047570 | 11/2014 |
| WO | PCT/US2015/025894 | 7/2015 |
| WO | PCT/US2015/032999 | 8/2015 |
| WO | PCT/US2016013174 | 5/2016 |

OTHER PUBLICATIONS

U.S. Appl. No. 14/152,664, filed Jan. 10, 2014, Karda.
U.S. Appl. No. 14/260,977, filed Apr. 24, 2014, Ramaswamy.
U.S. Appl. No. 14/305,459, filed Jun. 16, 2014, Ramaswamy et al.
U.S. Appl. No. 14/508,912, filed Oct. 7, 2014, Ramaswamy.
Breakdown of High-Performance Monolayer MoS2 Transistors; Lembke et al.; www.acsnano.org; Oct. 2012; pp. A-F.
Current Status of Ferroelectric Random-Acess Memory; Arimoto et al.; MRS Bulletin; Nov. 2004; pp. 823-828.
Das et al.; High Performance Multliayer MoS2 Transistors with Scandium Contacts; NANO Letters; ACS Publications; Dec. 14, 2012; pp. 100-105
Ferroelectric Nonvolatile Nanowire Memory Circuit Using a Single ZnO Nanowire and Copolymer Top Layer; Tack Lee et al.; Advanced Materials 2012, 24, pp. 3020-3025.
Ferroelectric RAM; http://en.wikipedia.org/wiki/Ferroelectric_RAM; Last Modified Feb. 25, 2013; 6 pp.
Large Area Vapor Phase Growth and Characterization of MoS2 Atomic Layers on SiO2 Substrate; Zhan et al.; Dept. of Mechanical Engineering & Materials Science; Rice University: Feb. 15, 2012; 24 pp.
Liu et al.; Growth of Large-Area and Highly Crystailine MoS2 Thin Layers on Insulating Substrates; NANO Letters; ACS Publications; Feb. 27, 2012; pp. 1538-1544.
Min et al.; Nanosheet thickness-modulated MoS2 dielectric property evidenced by field-effect transistor performance; The Royal Society of Chemistry; Dec. 3, 2012; 2 pp.
MoS 2 Nanosheets for Top-Gate Nonvolatile Memory Transistor Channel; Sung Lee et al.; Small 2012,8, No. 20, pp. 3111-3115.
Nonvolatile ferroelectric-gate field-effect transistors using SrBi2Ta2O9/Pt/SRTa2O6/SiON/Si structures; E. Tokumitsu; Applied Physics Letters, vol. 75, No. 4; Jul. 26, 1999; pp. 575-577.
R.S. Lous; Ferroelectric Memory Devices, How to store information of the future; Top Master Programme in Nanoscience; Jul. 2011; 23 pp.
Recent Progress of Ferroelectric-Gate Field-Effect Transistors and Applications to Nonvolatile Logic and FeNAND Flash Memory; Sakai et al.; Materials 2010, 3, Nov. 18, 2010; pp. 4950-4964.
Single-layer MoS2 transistors; Radisavijevic et al.; Nature Nanotechnology; vol. 6; Mar. 2011; pp. 147-150.
W. Liu et al.; Role of Metal Contacts in Designing High-Performance Monolayer n-Type WSe2 Field Effect Transistors; NANO Letters; ACS Publications; Mar. 25, 2013; pp. 1983-1990.
Zhang et al.; Ambipolar MoS2 thin Flake Transistors; NANO Letters; ACS Publications; Jan. 25, 2012; pp. 1136-1140.
Pandey et al., "Structural, ferroelectric and optical properties of PZT thin films", 2005, Physica B, vol. 368, Nov. 2005; pp. 135-142.
Robertson, "Band offsets of wide-band-gap oxides and implications for future electronic devices"; J. Vac. Sci. Technol., B 18(3); May 2000; pp. 1785-1791.
PCT/US2014/047570, Feb. 16, 2016, IPRP.
Kim et al., "A Functional Hybrid Memristor Crossbar Array/CMOS System for Data Storage and Neuromorphic Applications," Nano Letters; Dec. 5, 2011; pp. 389-395.
Lee et al., "Internal resistor of multi-functional tunnel barrier for selectivity and switching uniformity in resistive random access memory," Nanoscale Research Letters, 2014; 7 pp.

* cited by examiner

MEMORY CELL AND AN ARRAY OF MEMORY CELLS

TECHNICAL FIELD

Embodiments disclosed herein pertain to memory cells and to arrays of memory cells.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information. The memory cells might be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/re-written to maintain data storage. Volatile memory may have a retention time of milliseconds, or less.

Integrated circuitry fabrication continues to strive to produce smaller and denser integrated circuits. There is a continuing effort to reduce the number of components in individual devices because such can reduce the size of finished constructions and simplify processing. The smallest and simplest memory cell will likely be comprised of two electrodes having a programmable material, and possibly a select device (such as a diode or ovonic threshold switch), received between them. Suitable programmable materials have two or more selectable memory states to enable storing of information by an individual memory cell. The reading of the cell comprises determination of which of the states the programmable material is in, and the writing of information to the cell comprises placing the programmable material in a predetermined state. Some programmable materials retain a memory state in the absence of refresh, and thus may be incorporated into nonvolatile memory cells.

DETAILED DESCRIPTION OF EXAMPLE EMBODIMENTS

Figure 1:
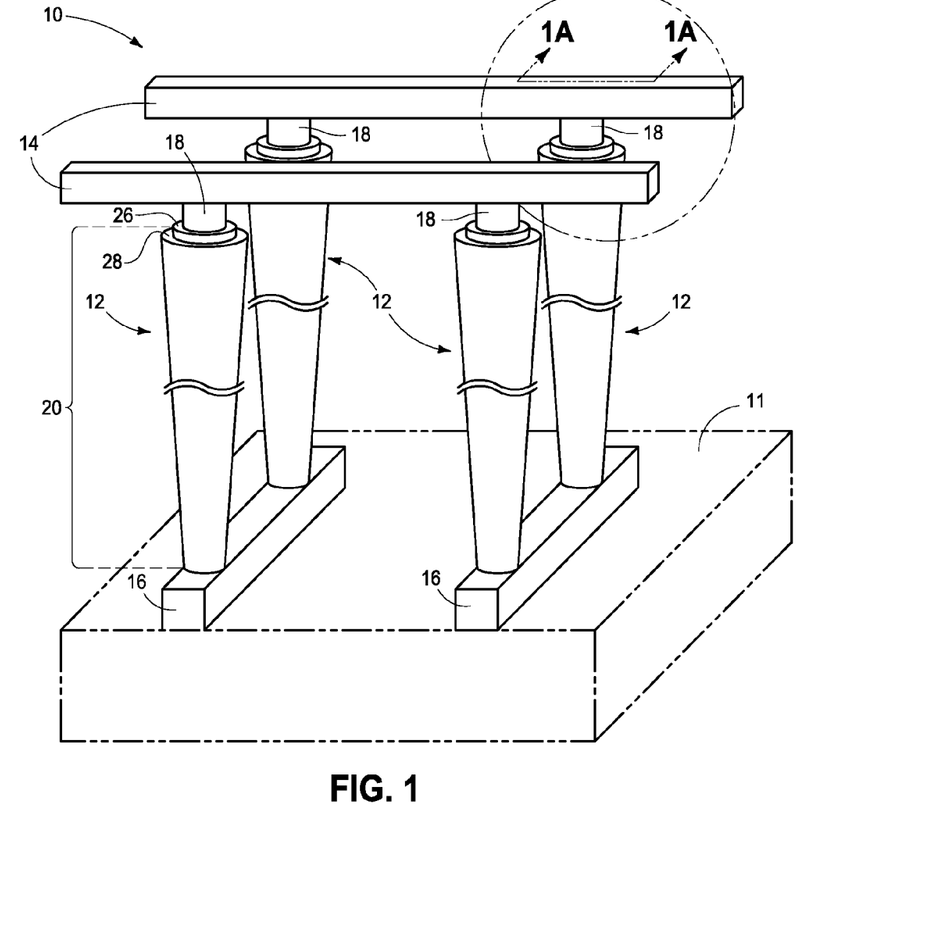
FIG. 1 is a diagrammatic perspective view of a portion of a memory array in accordance with an embodiment of the invention.
Figure 1A:
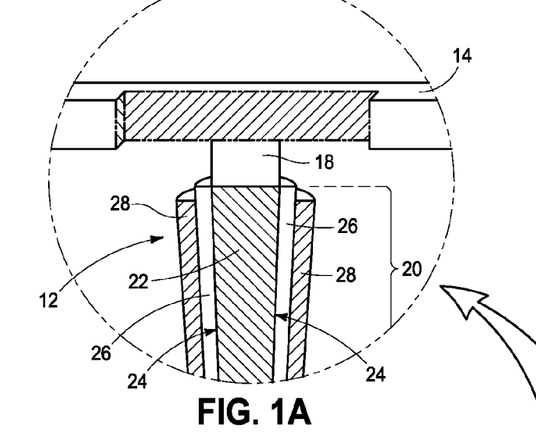
FIG. 1A is an enlargement of a portion of FIG. 1, including a cutaway portion.

Embodiments of the invention encompass a memory cell and an array of memory cells. FIG. 1 shows a portion of a substrate construction comprising an array 10 of individual memory cells 12 that has been fabricated relative to a base substrate 11. Only four memory cells 12 are shown, with an array of such memory cells likely including thousands or millions of individual memory cells. FIGS. 1 and 1A are diagrammatic depicting operative portions of the memory cells and conductive lines that form a part thereof and/or to which such connect. Solid dielectric material would likely be received entirely about the depicted construction, but is not shown in the figures for clarity with respect to operative components. Substrate 11 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Partially or wholly fabricated components of integrated circuitry may be formed as part of, or be elevationally inward of, substrate material 11.

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Array 10 comprises spaced first lines 14, spaced second lines 16 which cross first lines 14, and an individual memory cell 12 between first lines 14 and second lines 16 where such cross. Reference to "first" and "second" with respect to different components herein is only for convenience in description in referring to different components. Accordingly, "first" and "second" may be interchanged independent of relative position within the finished circuit construction and independent of sequence in fabrication. Lines 14 and 16 comprise conductive (i.e., electrically) material, with examples being elemental metals, a mixture or alloy of two or more elemental metals, conductive metal compounds, and conductively-doped semiconductive materials. Lines 14 and 16 may be of the same composition or of different compositions relative one another.

Referring to FIGS. 1, 1A, 2, and 3, the discussion proceeds with reference to an individual memory cell 12, with each of memory cells 12 in an individual memory array likely being of the same essential construction relative one another. Memory cell 12 comprises a first electrode 14 (e.g., at least a portion of a first line 14) and a second electrode 16 (e.g., at least a portion of a second line 16). Memory cell 12 also comprises a select device 18 and a programmable device 20 which are in series (i.e., electrical connection) with each other between first electrode 14 and second electrode 16. The select device is proximate to (e.g., more so than is the programmable device) and electrically coupled to the first electrode. The programmable device is proximate to (e.g., more so than is the select device) and electrically coupled to the second electrode. Again, use of "first" and "second" is for convenience only and the second electrode may be considered as the first electrode while the first electrode may considered as the second electrode. Additionally or regardless, the select device may be proximate and electrically coupled to the second electrode and the programmable device may be proximate and electrically coupled to the first electrode. Examples for each are shown and described herein. In the context of this document, devices or components are electrically coupled relative one another if in normal operation electric current is capable of continuously flowing from one to the other, and does so predominately by movement of subatomic positive and/or negative charges when such are sufficiently generated as opposed to predominately by movement of ions.

Figure 2:
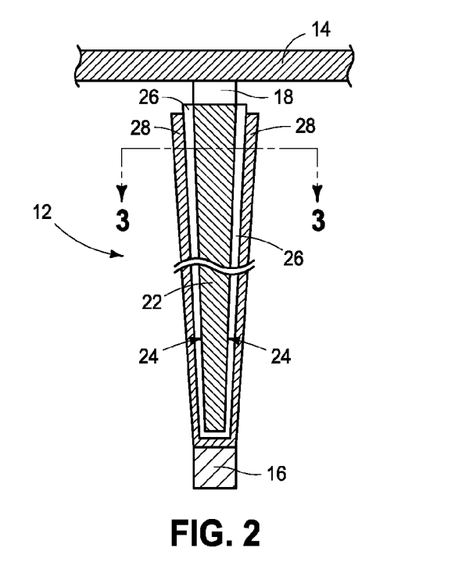
FIG. 2 is a vertical cross section taken along a longitudinal or axial center of one of the memory cells in the array of FIG. 1.
Figure 3:
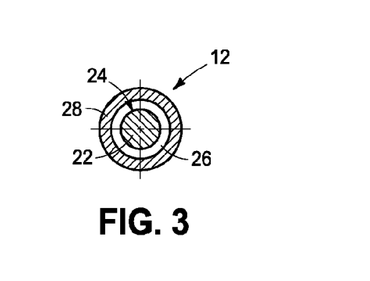
FIG. 3 is a horizontal cross section taken through line 3-3 in FIG. 2.

FIGS. 1-3 show an example embodiment wherein select device 18 is proximate and electrically coupled to first electrode 14 and programmable device 20 is proximate and electrically coupled to second electrode 16. Additionally, and in one embodiment, FIGS. 1-3 show an example wherein first electrode 14 comprises an upper electrode, and second electrode 16 comprises a lower electrode. In this document, "upper", "lower", "elevational", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space. In one embodiment and as shown, no intervening circuit component is between select device 18 and first electrode 14. In one embodiment and as shown, no intervening circuit component is between programmable device 20 and second electrode 16. In one embodiment and as shown, select device 18 is directly against first electrode 14. In one embodiment and as shown, programmable device 20 is directly against second electrode 16.

Select device 18 may be formed of any suitable material(s) to provide a select device function. Examples include a tunnel junction device and a diode. Example diodes include PN diodes, PIN diodes, Schottky diodes, Zener diodes, avalanche diodes, tunnel diodes, diodes having more than three different materials, etc. As additional examples, select device 18 may be a junction field effect or bipolar transistor. In one embodiment, select device 18 comprises a metal-semiconductor-metal diode construction. Example metals include elemental form metals, alloys of two or more elemental metals, and conductive metal compounds. Example semiconductor materials include silicon, for example amorphous, monocrystalline, and polycrystalline silicon which may be doped with a conductivity modifying impurity. Example thicknesses for the metal, semiconductor, metal in such a construction is about 100 to 150 Angstroms, 50 to 500 Angstroms, and 100 to 150 Angstroms, respectively. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness.

Programmable device 20 comprises a radially inner electrode 22 having radially outer sidewalls 24. In one embodiment and as shown, inner electrode 22 is of a solid pillar shape in a vertical cross-section taken through an axial center of inner electrode 22 (e.g., a vertical cross-section which is FIG. 2), and in one embodiment is directly against select device 18. Example materials for electrode 22 include any of those described above for lines 14 and 16. Ferroelectric material 26 has been formed radially outward of the outer sidewalls of inner electrode 22, and in one embodiment is directly against material 22. Any suitable existing or yet-to-be-developed ferroelectric material may be used. Examples include ferroelectrics that have one or more of transition metal oxide, zirconium, zirconium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare earth element. Two specific examples are $Hf_xSi_yO_z$ (e.g., including hafnium oxide doped with silicon dioxide) and $Hf_xZr_yO_z$. An example thickness for ferroelectric material 26 is about 30 to 100 Angstroms. In one embodiment and as shown, ferroelectric material 26 circumferentially surrounds inner electrode 22 in at least one horizontal cross-section (e.g., a horizontal cross-section which is FIG. 3).

A radially outer electrode 28 is radially outward of ferroelectric material 26, and in one embodiment is directly against material 26. Example materials include any of those described above for inner electrode 22. Electrodes 22 and 28 may be of the same composition or of different compositions relative one another. An example thickness for outer electrode 28 is about 30 to 100 Angstroms. In one embodiment and as shown, outer electrode 28 completely circumferentially surrounds ferroelectric material 26 in at least one horizontal cross-section (e.g., that of FIG. 3). In one embodiment and as shown, outer electrode 28 is of an upwardly open container-like shape in a vertical cross-section taken through an axial center of outer electrode 28 (e.g., that of FIG. 2).

One of the outer electrode or the inner electrode is electrically coupled to the select device with the other being electrically coupled to the second electrode. FIGS. 1-3 depict an example embodiment wherein outer electrode 28 is electrically coupled to second electrode 16 and inner electrode 22 is electrically coupled to select device 18. In one embodiment, inner electrode 22 is directly against select device 18, and in one embodiment select device 18 is directly against first electrode 14. In one embodiment, outer electrode 28 is directly against second electrode 16.

FIGS. 1-3 show programmable device 20 as tapering radially inward moving elevationally inward towards base substrate 11 (FIG. 1), likely an artifact of manufacture. Alternately as examples, components of programmable device 20 may have vertical sidewalls or taper radially outward. An example elevational thickness for programmable device 20 is about 0.1 micron to 1.5 microns.

Figure 4:
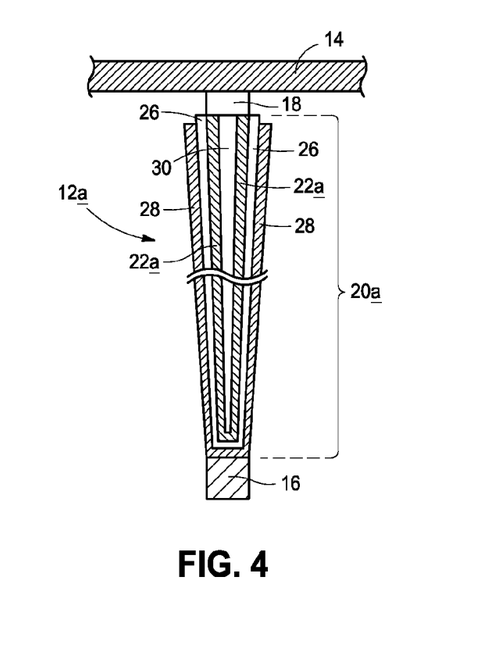
FIG. 4 is a vertical cross section taken along a longitudinal or axial center of an alternate embodiment memory cell.

FIG. 4 shows an alternate example embodiment memory cell 12a. Like numerals from the above-described embodiments have been used where appropriate, with some construction differences being indicated with the suffix "a" or with different numerals. Inner electrode 22a of programmable device 20a is of an upwardly open container-like shape in a vertical cross-section taken through an axial center of inner electrode 22a. A dielectric material 30 has been formed there-within. Example dielectric materials are silicon nitride and doped or undoped silicon dioxide.

Figure 5:
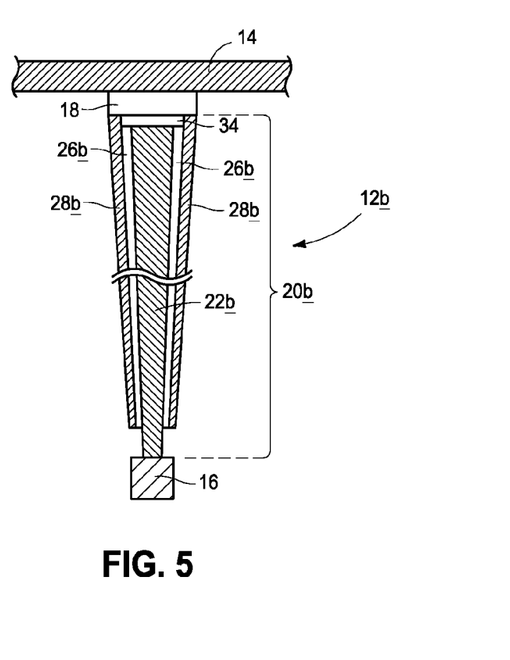
FIG. 5 is a vertical cross section taken along a longitudinal or axial center of an alternate embodiment memory cell.

An alternate memory cell 12b in accordance with an embodiment of the invention is shown in FIG. 5. Like numerals from the above-described embodiments have been used where appropriate, with some construction differences being indicated with the suffix "b" or with different numerals. FIG. 5 shows a memory cell 12b wherein programmable device 20b has outer electrode 28b electrically coupled to select device 18 and inner electrode 22b electrically coupled to second electrode 16. In one embodiment and as shown, ferroelectric material 26b is of an upwardly open and downwardly open cylinder-like shape in a vertical cross-section taken through an axial center of ferroelectric material 26b (e.g., the vertical cross-section shown by FIG. 5). In one embodiment and as shown, outer electrode 28b is of an upwardly open and downwardly open cylinder-like shape in a vertical cross-section taken through an axial center of the outer electrode. As an alternate or additional example, inner electrode 22b may be fabricated of an upwardly open container-like shape (not shown) analogous to that shown for inner electrode 22a in FIG. 4. A dielectric 34 electrically isolates inner electrode 22b from select device 18. Example dielectric materials are any of those described above for dielectric material 30.

Figure 6:
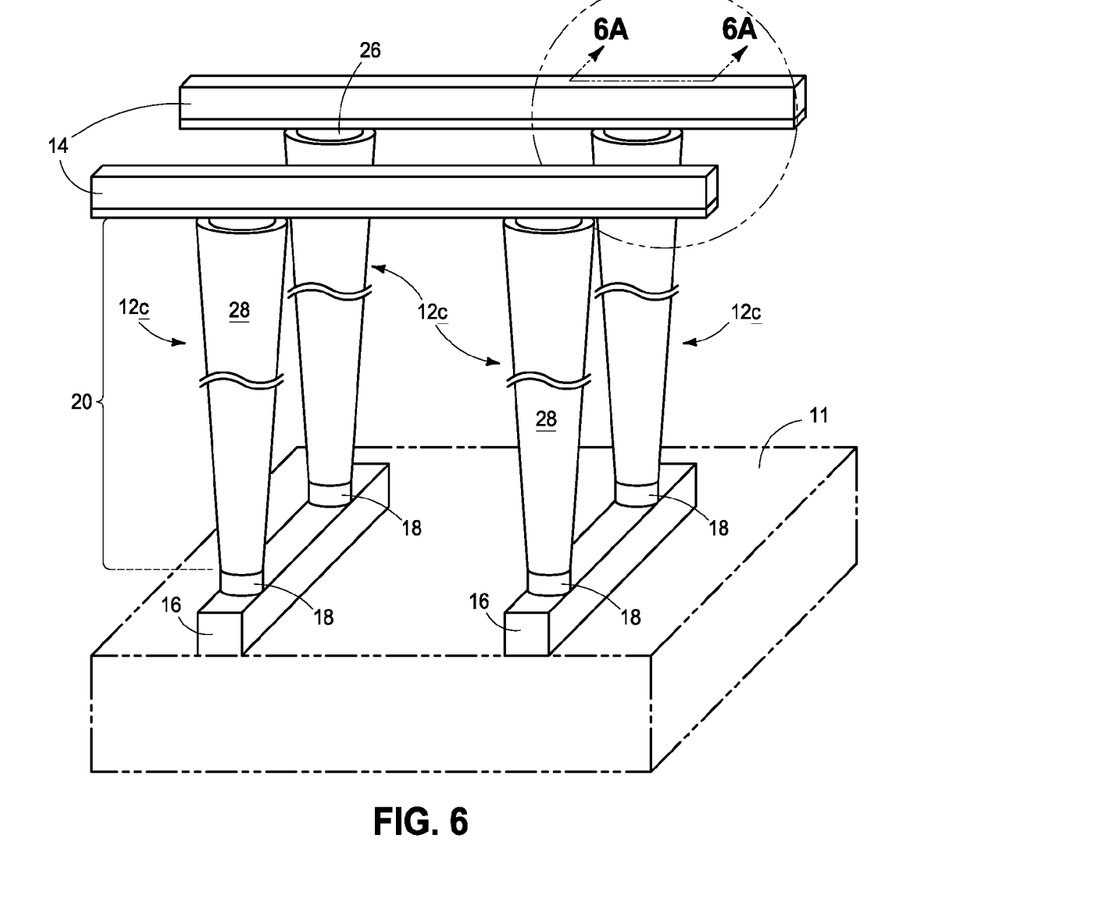
FIG. 6 is a diagrammatic perspective view of a portion of an alternate memory array in accordance with an embodiment of the invention.
Figure 6A:
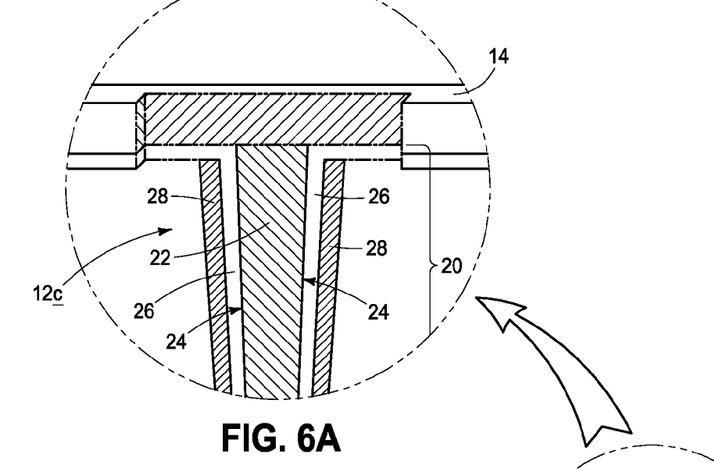
FIG. 6A is an enlargement of a portion of FIG. 6, including a cutaway portion.
Figure 7:
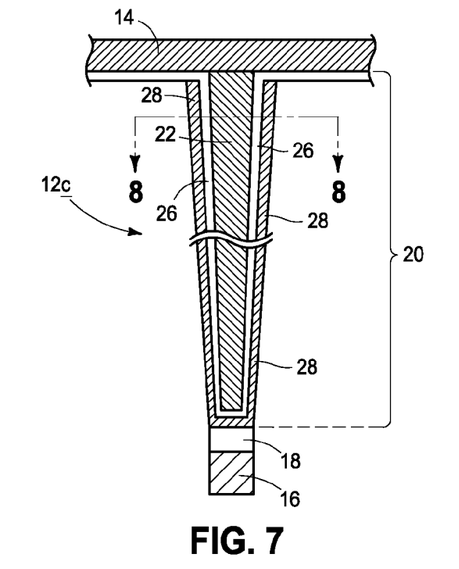
FIG. 7 is a vertical cross section taken along a longitudinal or axial center of one of the memory cells in the array of FIG. 6.
Figure 8:
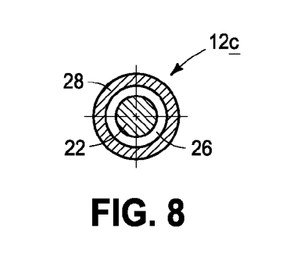
FIG. 8 is a horizontal cross section taken through line 8-8 in FIG. 7.

Example additional embodiments in accordance with the invention are next described with reference to FIGS. 6-11 wherein the select device is proximate to and electrically couples to the second or lower electrode and the programmable device is proximate to and electrically couples to the first or upper electrode. Referring to FIGS. 6-8, an alternate embodiment memory cell 12c is shown. Like numerals from the above-described embodiments have been used where appropriate, with some construction differences being indicated with the suffix "c" or with different numerals. FIGS. 6-8 show an embodiment largely analogous to that of FIGS. 1-3 however wherein select device 18 is between outer electrode 28 and second electrode 16 and inner electrode 22 electrically couples to first electrode 14. In one embodiment, inner electrode 22 is directly against first electrode 14. In one embodiment, outer electrode 28 is directly against select device 18, and in one embodiment select device 18 is directly against second electrode 16.

The ferroelectric material may be directly against one (i.e., at least one) of the first and second electrodes, may be directly against only one of the first and second electrodes, or may not be directly against either of the first and second electrodes. FIGS. 1-5 show example embodiments wherein the ferroelectric material is not directly against either of electrodes 14 and 16. Alternately as examples, ferroelectric material 26 in the FIGS. 1-4 embodiments may extend to be directly against (not shown) first electrode 14 (e.g., including to extend longitudinally there-along). In the FIG. 5 embodiment, ferroelectric material 26b may extend to be directly against (not shown) second electrode 16 (e.g., including to extend longitudinally there-along). In the FIGS. 6-8 embodiment, ferroelectric material 26 extends to be directly against first electrode 16 and to extend longitudinally there-along. As alternate examples, ferroelectric material 26 may be directly against but not extend longitudinally along (not shown) first electrode 14, or not be directly against (not shown) first electrode 14.

Figure 9:
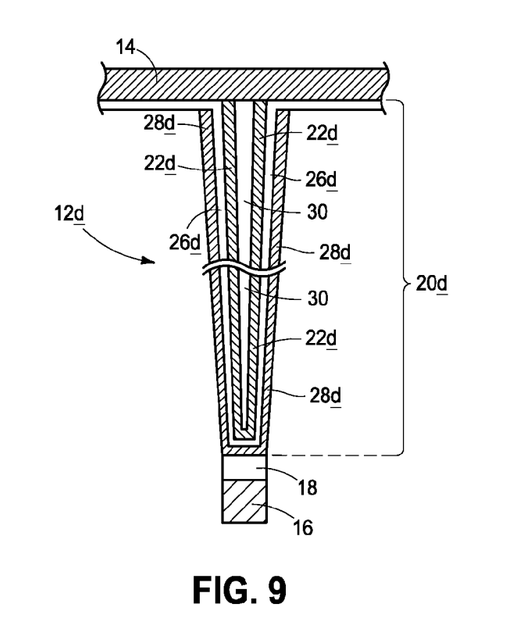
FIG. 9 is a vertical cross section taken along a longitudinal or axial center of an alternate embodiment memory cell.

An alternate memory cell 12d in accordance with an embodiment of the invention is shown in FIG. 9. Like numerals from the above-described embodiments have been used where appropriate, with some construction differences being indicated with the suffix "d" or with different numerals. Memory cell construction 12d is analogous to that of FIG. 4, except wherein outer electrode 28d of programmable device 20d electrically couples (e.g., directly in the absence of any intervening circuit component) to select device 18 and inner electrode 22d electrically couples (e.g., directly in the absence of any intervening circuit component) to first electrode 14. Inner electrode 22d of programmable device 20d is of an upwardly open container-like shape in a vertical cross-section taken through an axial center of inner electrode 22d.

Figure 10:
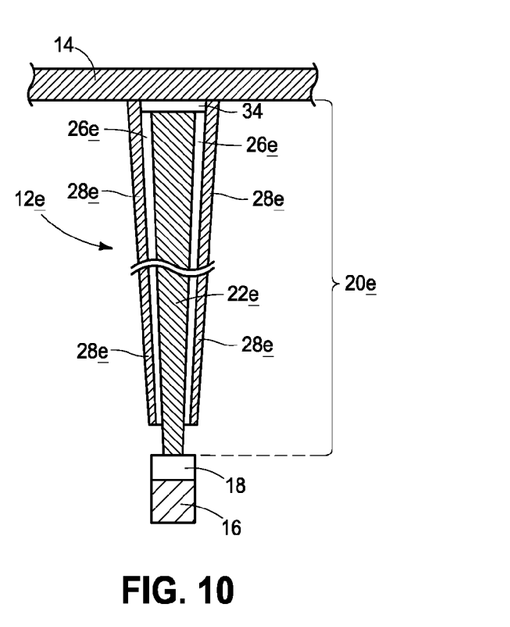
FIG. 10 is a vertical cross section taken along a longitudinal or axial center of an alternate embodiment memory cell.

An alternate memory cell 12e in accordance with an embodiment of the invention is shown in FIG. 10. Like numerals from the above-described embodiments have been used where appropriate, with some construction differences being indicated with the suffix "e" or with different numerals. Memory cell construction 12e is analogous to that of FIG. 5, except wherein inner electrode 22e of programmable device 20e electrically couples (e.g., directly in the absence of any intervening circuit component) to select device 18 and outer electrode 28e electrically couples (e.g., directly in the absence of any intervening circuit component) to first electrode 14. Inner electrode 22e of programmable device 20e is of a solid pillar shape in a vertical cross-section taken through an axial center of inner electrode 22e. Ferroelectric material 26e is of an upwardly open and downwardly open cylinder-like shape in a vertical cross-section taken through an axial center of ferroelectric material 26. Outer electrode 28e is of an upwardly open and downwardly open cylinder-like shape in a vertical cross-section taken through an axial center of the outer electrode.

Figure 11:
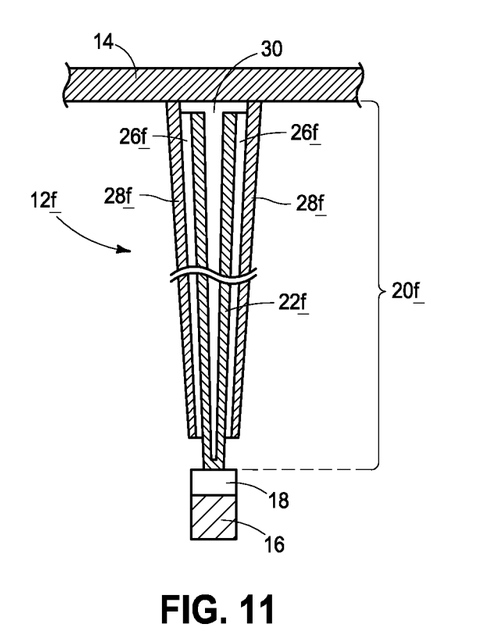
FIG. 11 is a vertical cross section taken along a longitudinal or axial center of an alternate embodiment memory cell.

An alternate memory cell 12f in accordance with an embodiment of the invention is shown in FIG. 11. Like numerals from the above-described embodiments have been used where appropriate, with some construction differences being indicated with the suffix "f" or with different numerals. Memory cell construction 12f is analogous to that of FIG. 10, except wherein inner electrode 22f is not of a solid pillar shape but rather of an upwardly open container-like shape.

CONCLUSION

In some embodiments, a memory cell comprises a first electrode and a second electrode. A select device and a programmable device are in series with each other between the first and second electrodes. The select device is proximate and electrically coupled to the first electrode. The programmable device is proximate and electrically coupled to the second electrode. The programmable device comprises a radially inner electrode having radially outer sidewalls. Ferroelectric material is radially outward of the outer sidewalls of the inner electrode. A radially outer electrode is radially outward of the ferroelectric material. One of the outer electrode or the inner electrode is electrically coupled to the select device. The other of the outer electrode and the inner electrode is electrically coupled to the second electrode.

In some embodiments, a memory cell comprises an upper electrode and a lower electrode. A select device and a programmable device are in series with each other between the upper and lower electrodes. The select device is proximate and electrically coupled to the upper electrode. The programmable device is proximate and electrically coupled to the lower electrode. The programmable device comprises a radially inner electrode having radially outer sidewalls. The inner electrode is of a solid pillar shape in a vertical cross section taken through an axial center of the inner electrode. Ferroelectric material is radially outward of the outer sidewalls of the inner electrode. The ferroelectric material is of an upwardly open container-like shape in a vertical cross section taken through an axial center of the ferroelectric material. A radially outer electrode is radially outward of the ferroelectric material. The outer electrode is of an upwardly open container-like shape in a vertical cross section taken through an axial center of the outer electrode. The inner electrode of pillar shape is electrically coupled to the select device. The outer electrode of container-like shape is electrically coupled to the lower electrode.

In some embodiments, a memory cell comprises an upper electrode and a lower electrode. A select device and a programmable device are in series with each other between the upper and lower electrodes. The select device is proximate and electrically coupled to the upper electrode. The programmable device is proximate and electrically coupled to the lower electrode. The programmable device comprises a radially inner electrode having radially outer sidewalls. The inner electrode is of a solid pillar shape in a vertical cross section taken through an axial center of the inner electrode. Ferroelectric material is radially outward of the outer sidewalls of the inner electrode. The ferroelectric material is of an upwardly open container-like shape in a vertical cross section taken through an axial center of the ferroelectric material. A radially outer electrode is radially outward of the ferroelectric material. The outer electrode is of an upwardly open container-like shape in a vertical cross section taken through an axial center of the outer electrode. The inner electrode of pillar shape is electrically coupled to the select device. The outer electrode of container-like shape is electrically coupled to the lower electrode.

In some embodiments, an array of memory cells comprises spaced first lines, spaced second lines which cross the first lines, and an individual memory cell between the first lines and the second lines where such cross. The individual memory cells comprise a select device and a programmable device in series with each other. The select device is proximate and electrically coupled to the crossing first line. The programmable device is proximate and electrically coupled to the crossing second line. The programmable device comprises a radially inner electrode having radially outer sidewalls. Ferroelectric material is radially outward of the outer sidewalls of the inner electrode. A radially outer electrode is radially outward of the ferroelectric material. One of the outer electrode or the inner electrode is electrically coupled to the select device. The other of the outer electrode and the inner electrode is electrically coupled to the crossing second line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell, comprising:
   a first electrode and a second electrode;
   a select device and a programmable device in series with each other between the first and second electrodes, the select device being proximate and electrically coupled to the first electrode, the programmable device being proximate and electrically coupled to the second electrode; and
   the programmable device comprising:
   a radially inner electrode having radially outer sidewalls, the radially inner electrode being of an upwardly open container-like shape in a vertical cross section taken through an axial center of the radially inner electrode;
   ferroelectric material radially outward of the outer sidewalls of the radially inner electrode;
   a radially outer electrode radially outward of the ferroelectric material;
   one of the radially outer electrode or the radially inner electrode being electrically coupled to the select device, the other of the radially outer electrode and the radially inner electrode being electrically coupled to the second electrode; and
   the ferroelectric material not extending radially outward beyond the radially outer electrode.

2. The memory cell of claim 1 wherein the ferroelectric material completely circumferentially surrounds the radially inner electrode in at least one horizontal cross section.

3. The memory cell of claim 1 wherein the radially outer electrode completely circumferentially surrounds the ferroelectric material in at least one horizontal cross section.

4. The memory cell of claim 1 wherein the ferroelectric material is of an upwardly open container-like shape in a vertical cross section taken through an axial center of the ferroelectric material.

5. The memory cell of claim 1 wherein the radially outer electrode is of an upwardly open container-like shape in a vertical cross section taken through an axial center of the radially outer electrode.

6. The memory cell of claim 1 wherein the radially outer electrode is electrically coupled to the select device and the radially inner electrode is electrically coupled to the second electrode.

7. The memory cell of claim 1 wherein the radially outer electrode is electrically coupled to the second electrode and the radially inner electrode is electrically coupled to the select device.

8. The memory cell of claim 1 wherein the ferroelectric material is directly against one of the first electrode and the second electrode.

9. The memory cell of claim 1 wherein the ferroelectric material is not directly against either of the first and second electrodes.

10. The memory cell of claim 1 wherein no intervening circuit component is between the one of the radially outer electrode and the radially inner electrode and the select device.

11. The memory cell of claim 1 wherein no intervening circuit component is between the other of the radially outer electrode and the radially inner electrode and the second electrode.

12. The memory cell of claim 1 wherein the ferroelectric material comprises hafnium oxide doped with silicon dioxide.

13. An array of the memory cells of claim 1.

14. A memory cell, comprising:
a first electrode and a second electrode;
a select device and a programmable device in series with each other between the first and second electrodes, the select device being proximate and electrically coupled to the first electrode, the programmable device being proximate and electrically coupled to the second electrode; and
the programmable device comprising:
a radially inner electrode having radially outer sidewalls;
ferroelectric material radially outward of the outer sidewalls of the radially inner electrode;
a radially outer electrode radially outward of the ferroelectric material;
one of the radially outer electrode or the radially inner electrode being electrically coupled to the select device, the other of the radially outer electrode and the radially inner electrode being electrically coupled to the second electrode; and
conductive material of the radially inner electrode where between the first and second electrodes being everywhere of a solid pillar shape in a vertical cross section taken through an axial center of the radially inner electrode.

15. An array of the memory cells of claim 14.

16. A memory cell, comprising:
a first electrode and a second electrode;
a select device and a programmable device in series with each other between the first and second electrodes, the select device being proximate and electrically coupled to the first electrode, the programmable device being proximate and electrically coupled to the second electrode; and
the programmable device comprising:
a radially inner electrode having radially outer sidewalls;
ferroelectric material radially outward of the outer sidewalls of the radially inner electrode;
a radially outer electrode radially outward of the ferroelectric material;
one of the radially outer electrode or the radially inner electrode being electrically coupled to the select device, the other of the radially outer electrode and the radially inner electrode being electrically coupled to the second electrode; and
the ferroelectric material being of an upwardly open and downwardly open cylinder-like shape in a vertical cross section taken through an axial center of the ferroelectric material.

17. An array of the memory cells of claim 16.

18. A memory cell, comprising:
a first electrode and a second electrode;
a select device and a programmable device in series with each other between the first and second electrodes, the select device being proximate and electrically coupled to the first electrode, the programmable device being proximate and electrically coupled to the second electrode; and
the programmable device comprising:
a radially inner electrode having radially outer sidewalls;
ferroelectric material radially outward of the outer sidewalls of the radially inner electrode;
a radially outer electrode radially outward of the ferroelectric material;
one of the radially outer electrode or the radially inner electrode being electrically coupled to the select device, the other of the radially outer electrode and the radially inner electrode being electrically coupled to the second electrode; and
conductive material of the radially outer electrode being of an upwardly open and downwardly open cylinder-like shape in a vertical cross section taken through an axial center of the radially outer electrode.

19. An array of the memory cells of claim 18.

20. A memory cell, comprising:
a first upper electrode and a second lower electrode;
a select device and a programmable device in series with each other and being elevationally between the first upper electrode and the second lower electrode, the select device being proximate and electrically coupled to one of the first upper electrode and the second lower electrode, the programmable device being proximate and electrically coupled to the other of the first upper electrode and the second lower electrode; and
the programmable device comprising:
a radially inner electrode having radially outer sidewalls;
ferroelectric material radially outward of the outer sidewalls of the radially inner electrode;
a radially outer electrode radially outward of the ferroelectric material;
one of the radially outer electrode or the radially inner electrode being electrically coupled to the select device, the other of the radially outer electrode and the radially inner electrode being electrically coupled to the second electrode; and
the ferroelectric material being directly against one of the first upper electrode and the second lower electrode but not directly against the other of the first upper electrode and the second lower electrode.

21. An array of the memory cells of claim 20.

22. A memory cell, comprising:
an upper electrode and a lower electrode;
a select device and a programmable device in series with each other and being elevationally between the upper and lower electrodes, the select device being proximate and electrically coupled to the upper electrode, the select device being above the programmable device, the programmable device being proximate and electrically coupled to the lower electrode, the programmable device being below the select device; and
the programmable device comprising:
a radially inner electrode having radially outer sidewalls, conductive material of the radially inner electrode where between the first and second electrodes being everywhere of a solid pillar shape in a vertical cross section taken through an axial center of the radially inner electrode;

ferroelectric material radially outward of the outer sidewalls of the radially inner electrode, the ferroelectric material being of an upwardly open container-like shape in a vertical cross section taken through an axial center of the ferroelectric material;

a radially outer electrode radially outward of the ferroelectric material, the radially outer electrode being of an upwardly open container-like shape in a vertical cross section taken through an axial center of the radially outer electrode; and the radially inner electrode of pillar shape being electrically coupled to the select device, the radially outer electrode of container-like shape being electrically coupled to the lower electrode.

23. The memory cell of claim 22 wherein the radially inner electrode of pillar shape is directly against the select device and the select device is directly against the upper electrode.

24. The memory cell of claim 23 wherein the radially outer electrode of container-like shape is directly against the radially inner electrode.

25. An array of the memory cells of claim 22.

26. A memory cell, comprising:

an upper electrode and a lower electrode;

a select device and a programmable device in series with each other and being elevationally between the upper and lower electrodes, the select device being proximate and electrically coupled to the lower electrode, the select device being below the programmable device, the programmable device being proximate and electrically coupled to the upper electrode, the programmable device being above the select device; and the programmable device comprising:

a radially inner electrode having radially outer sidewalls, the radially inner electrode being of an upwardly open container-like shape in a vertical cross section taken through an axial center of the radially inner electrode;

ferroelectric material radially outward of the outer sidewalls of the radially inner electrode;

a radially outer electrode radially outward of the ferroelectric material, the radially outer electrode being of an upwardly open container-like shape in the vertical cross section;

the radially outer electrode being electrically coupled to the select device, the radially inner electrode being electrically coupled to the upper electrode, the radially inner electrode projecting elevationally above the radially outer electrode, the radially inner electrode above the radially outer electrode not projecting radially outward of the radially outer electrode.

27. The memory cell of claim 26 wherein the ferroelectric material extends radially outward beyond the radially outer electrode.

28. The memory cell of claim 26 wherein, the select device is directly against lower electrode;

the radially outer electrode is directly against the select device; and the radially inner electrode is directly against the upper electrode.

29. The memory cell of claim 28 wherein the ferroelectric material extends radially outward beyond the radially outer electrode and is directly against the upper electrode and a top of the radially outer electrode.

\* \* \* \* \*